(12) United States Patent
Durbano et al.

(10) Patent No.: US 7,194,497 B2
(45) Date of Patent: Mar. 20, 2007

(54) HARDWARE-BASED ACCELERATOR FOR TIME-DOMAIN SCIENTIFIC COMPUTING

(75) Inventors: James P. Durbano, Ridley Park, PA (US); Dennis W. Prather, Landenberg, PA (US)

(73) Assignee: EM Photonics, Inc., Newark, DE (US)

( * ) Notice: Subject to any disclaimer, the term of this patent is extended or adjusted under 35 U.S.C. 154(b) by 783 days.

(21) Appl. No.: 10/295,642

(22) Filed: Nov. 15, 2002

(65) Prior Publication Data

US 2003/0097544 A1 May 22, 2003

Related U.S. Application Data

(60) Provisional application No. 60/333,810, filed on Nov. 19, 2001.

(51) Int. Cl.
G06F 7/38 (2006.01)

(52) U.S. Cl. .................................. 708/443

(58) Field of Classification Search ................ 708/443
See application file for complete search history.

(56) References Cited

OTHER PUBLICATIONS

Shi et al, "Electromagnetic analysis of axially symmetric diffractive optical elements illuminated by oblique incedent plane waves", vol. 18, No. 11/Nov. 2001/ J. Optical Society of America, pp. 2901-2907.*
Shi et al, "Numerical Study of Axisymmetric Dielectric Resonators", 2001 IEEE, pp. 1614-1619.*
Weedon et al, "Modeling and stability considerations for FDTD analys of wave propagation in lossy dispersive soils", SPIE vol. 2747, pp. 245-251.*
Juntunen et al, "Reduction of Numerical Dispersion in FDTD Method Through Artificial Anisotropy", 200 IEEE, pp. 582-588.*

Luneau et al, "Polarimetric responses of underground targets using an hybrid transfer function FDTD method", 1997 IEEE, pp. 826-829.*
Marrocco et al, "Time-Domain Maromodel of Planar Microwave Devices by FDTD and Moment Expansion", 2001 IEEE, pp. 1321-1328.*
J.R. Marek, *Investigation of a Design for a Finite-Difference Time Domain (FDTD) Hardware Accelerator*, Air Force Inst. of Tech., Wright-Patterson, AFB, M.S. Thesis (1991).
J.R. Marek et al., *A Dedicated VLSI Architecture for Finite-Difference Time Domain Calculations*, presented at The 8th Annual Review of Progress in Applied Computational Electromagnetics, Naval Postgraduate School (Monterey, California, 1992).

(Continued)

*Primary Examiner*—Tan V. Mai
(74) *Attorney, Agent, or Firm*—Connolly Bove Lodge & Hutz LLP

(57) ABSTRACT

The present invention is directed to an apparatus and methods that facilitate implementation of a practical Finite-Difference-Time-Domain (FDTD) hardware accelerator. The apparatus and methods of the present invention increase speed, reduce memory requirements, and/or simplify a FDTD hardware implementation. This is accomplished by providing one, some, or all of the following: a reformulated FDTD method to simplify the hardware implementation; a memory look-up table (MLUT) to decrease memory requirements; customized, floating-point arithmetic units optimized for speed to decrease execution time; a memory switching unit (MSU) that coordinates multiple memory reads and writes from/to multiple random access memories (RAMs) to simplify control; a data dependence unit (DDU) that determines all dependencies associated with a given calculation to simplify control; and/or a control unit based on a global counter to simplify control.

4 Claims, 2 Drawing Sheets

OTHER PUBLICATIONS

R.N. Schneider et al., *Application of FPGA Technology to Accelerate the Finite-Differnce Time-Domain (FDTD) Method*, presented at The 10th ACM Int'l Symposium on Field-Programmable Gate Arrays, (Monterey, California 2002).

J.P. Berenger, *A Perfectly Matched Layer for the Absorption of Electromagnetic Waves*, J. of Computational Physics, vol. 114, pp. 94-103 (1994).

K.S. Yee, *Numerical Solution of Initial Boundary Value Problems Involving Maxwell's Equations in Isotropic Media*, IEEE Transactions on Antennas and Propagation, vol. 14, pp. 302-307 (1966).

P. Placidi et al., *A Custom VLSI Archecture for the Solution of FDTD Equations*, IEICE Trans. Electron., vol. E85-C, No. 3, pp. 572-577 (Mar. 2002).

* cited by examiner

HARDWARE-BASED ACCELERATOR FOR TIME-DOMAIN SCIENTIFIC COMPUTING

CLAIM FOR PRIORITY

The present application claims priority of U.S. Provisional Patent Application Ser. No. 60/333,810, filed Nov. 19, 2001, the disclosure of which being incorporated by reference herein in its entirety.

BACKGROUND OF THE INVENTION

A. Field of the Invention

The present invention relates generally to hardware accelerators, and, more particularly to components and methods for facilitating implementation of a finite-difference time-domain (FDTD) hardware accelerator.

B. Description of the Related Art

No longer relegated to radio-frequency (RF) engineers, antenna designers, and military applications, electromagnetic analysis has become a key factor in many areas of advanced technology. From personal computers (PCs) with processor speeds approaching three (3) gigahertz (GHz) and wireless computer networks, to personal digital assistants (PDAs) with Internet capabilities and the seemingly ubiquitous cell phone, it seems that almost every electronic design now requires electromagnetic characterization. To facilitate this analysis, numerical techniques have been developed that allow computers to easily solve Maxwell's equations.

Maxwell's equations are a system of coupled, differential equations:

$$\nabla \cdot D = q_{ev}$$

$$\nabla \cdot B = q_{mv}$$

$$\nabla \times H = J_i + \sigma E + \frac{\partial D}{\partial t}$$

$$\nabla \times E = M_i - \frac{\partial B}{\partial t}.$$

As such, they can be represented in difference form, thus allowing their numerical solution. To see this, recall that the definition of the derivative is:

$$f'(x) = \lim_{\Delta x \to 0} \frac{f(x + \Delta x) - f(x)}{\Delta x}.$$

Implementing both temporal and spatial derivatives of Maxwell's equations in difference form produces the numerical technique known as the finite-difference time-domain (FDTD) method. In this approach, a region of interest is sampled to generate a grid of points, hereinafter referred to as a "mesh." The discretized forms of Maxwell's equations are then solved at each point in the mesh to determine the associated electromagnetic fields.

Although FDTD methods are accurate and well defined, current computer-system technology limits the speed at which these operations can be performed. Run times on the order of hours, weeks, months, or longer are common when solving problems of realistic size. Some problems are even too large to be effectively solved due to practical time and memory constraints. The slow nature of the algorithm primarily results from the nested for-loops that are required to iterate over the three spatial dimensions and time.

To shorten the computational time, people acquire faster computers, lease time on supercomputers, or build clusters of computers to gain a parallel processing speedup. These solutions can be prohibitively expensive and frequently impractical. As a result, there is a need in the art to increase the speed of the FDTD method in a relatively inexpensive and practical way. To this end, people have suggested that an FDTD accelerator, i.e., special-purpose hardware that implements the FDTD method, be used to speed up the computations. (See, e.g., J. R. Marek, *An Investigation of a Design for a Finite-Difference Time Domain (FDTD) Hardware Accelerator*, Air Force Inst. of Tech., Wright-Patterson AFB, M. S. Thesis (1991); J. R. Marek et al., *A Dedicated VLSI Architecture for Finite-Difference Time Domain Calculations*, presented at The 8th Annual Review of Progress in Applied Computational Electromagnetics, Naval Postgraduate School (Monterey, Calif. 1992); R. N. Schneider et al., *Application of FPGA Technology to Accelerate the Finite-Difference Time-Domain (FDTD) Method*, presented at The 10th ACM Int'l Symposium on Field-Programmable Gate Arrays, (Monterey, Calif. 2002); and P. Placidi et al., *A Custom VLSI Architecture for the Solution of FOTO Equations*, IEJCE Trans. Electron., vol. E85-C, No. 3, pp. 572–577 (March 2002)). Although limited success in developing hardware-based FDTD solvers has been shown, the related art still needs a practical, hardware-based solver. There are several reasons for this.

First, the conventional FDTD algorithm contains several distinct regions that require different mathematical expressions. These include the normal FDTD space, the absorbing boundary region, and the incident source condition. For software implementations, these regions are relatively simple to incorporate into a solver. Unfortunately, hardware designs are most efficient when they are asked to perform only one task. Incorporating functionality within a hardware accelerator to detect special regions and handle them differently increases hardware logic and slows the overall hardware design.

Second, a hardware-based FDTD solver puts great demands on the underlying memory architecture. Every node in the mesh requires storage of at least three electric fields and at least three magnetic fields, with each field being thirty-two (32) or sixty-four (64) bits. Also, every node has associated material parameters, including three permittivities, three permeabilities, and three conductivities. Again, these are likely to be thirty-two (32)-or sixty-four (64)-bit numbers. For a ten (10) million-node mesh, this requires several gigabytes of memory. Storage of the fields, however, is not the only memory concern. Just as important is the time to retrieve or fetch data from memory and to write updated results back to memory. This latency presents serious problems to practical hardware implementations.

Third, floating-point operations are desirable to maximize precision and to minimize numerical dispersion. However, floating-point operations tend to be slow and require specialized hardware.

Finally, hardware system control can be a daunting task. Millions of field components are constantly being retrieved or fetched from memory and updated field values are continuously being written back. For maximum throughput, it is desired to have a finely-tuned system in which all components are working together quickly and efficiently. However, the hardware control architecture necessary to oversee this can be very complex.

Thus, there is a need in the art to overcome these limitations, and to provide for practical hardware-based FDTD solvers.

SUMMARY OF THE INVENTION

The present invention solves the problems of the related art by providing components and/or methods that facilitate implementation of a practical FDTD hardware accelerator. The components and/or methods of the present invention increase speed, reduce memory requirements, and/or simplify a FDTD hardware implementation.

One embodiment of the present invention may utilize a reformulated FDTD method to simplify the hardware implementation. The details of this embodiment are discussed below and shown in FIG. 1. Yet another embodiment of the present invention is shown in FIG. 2. and may include a memory look-up table (MLUT) 213 to decrease memory requirements. In addition, this embodiment of the present invention may use customized, floating-point arithmetic units 215 optimized for speed to decrease execution time. Further, this embodiment of the present invention may utilize a memory switching unit (MSU) 207 that coordinates multiple memory reads and writes from/to multiple random access memories (RAMs) 209A, 209B, 209C to simplify control. Furthermore, this embodiment of the present invention may include a data dependence unit (DDU) 203 that determines all dependencies associated with a given calculation to simplify control. Finally, this embodiment of the present invention may use a system control unit 201 based on a global counter to simplify control.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF DRAWINGS

As shown in FIG. 1, the present invention is also a method for implementing a finite-difference time-domain (FDTD) hardware accelerator. Step 101 of FIG. 1 involves reformulating an FDTD algorithm by embedding a normal FDTD space, an absorbing boundary region, and an incident source condition into a single set of mathematical expressions. Step 103 of FIG. 1 is directed toward storing a small bit vector representing a material type of a node of a mesh. Providing a material look-up table that stores values of coefficients that can be looked up based on the material type occurs in Step 105. Step 107 of FIG. 1 involves providing customized, floating-point arithmetic units based on the IEEE 754 standard. Step 109 is directed toward providing a memory switching unit responsible for handling all memory input/output (I/O) requests. Providing a data dependence unit that determines which field values are required to update a given field component occurs in step 111. Step 113 of FIG. 1 is directed toward providing a system control that utilizes a counter-based finite-state machine (ESM). Details of the method of the present invention discussed above are provided in the following paragraphs.

Figure 1:
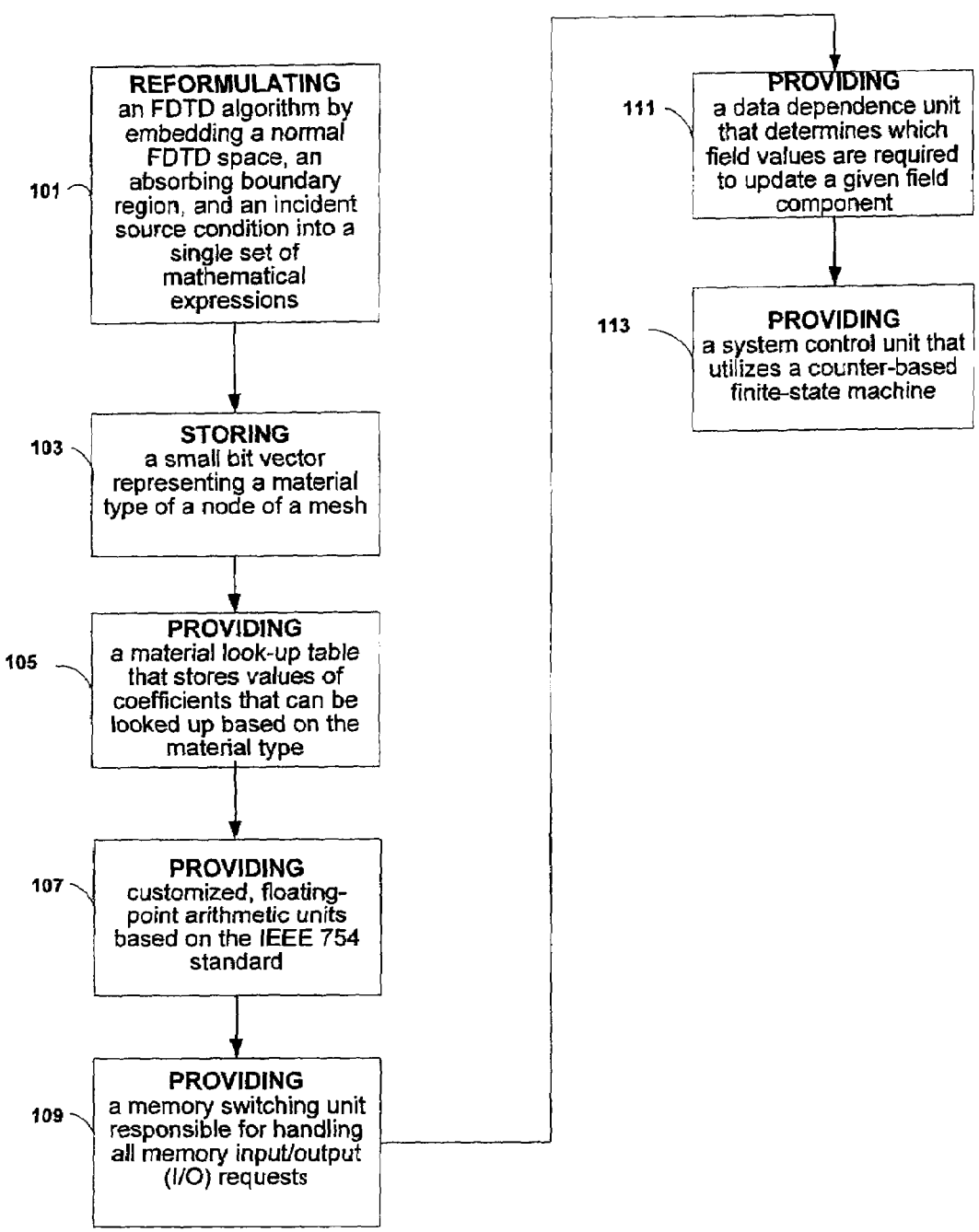
FIG. 1 is an exemplary flow diagram of the method of the present invention.
Figure 2:
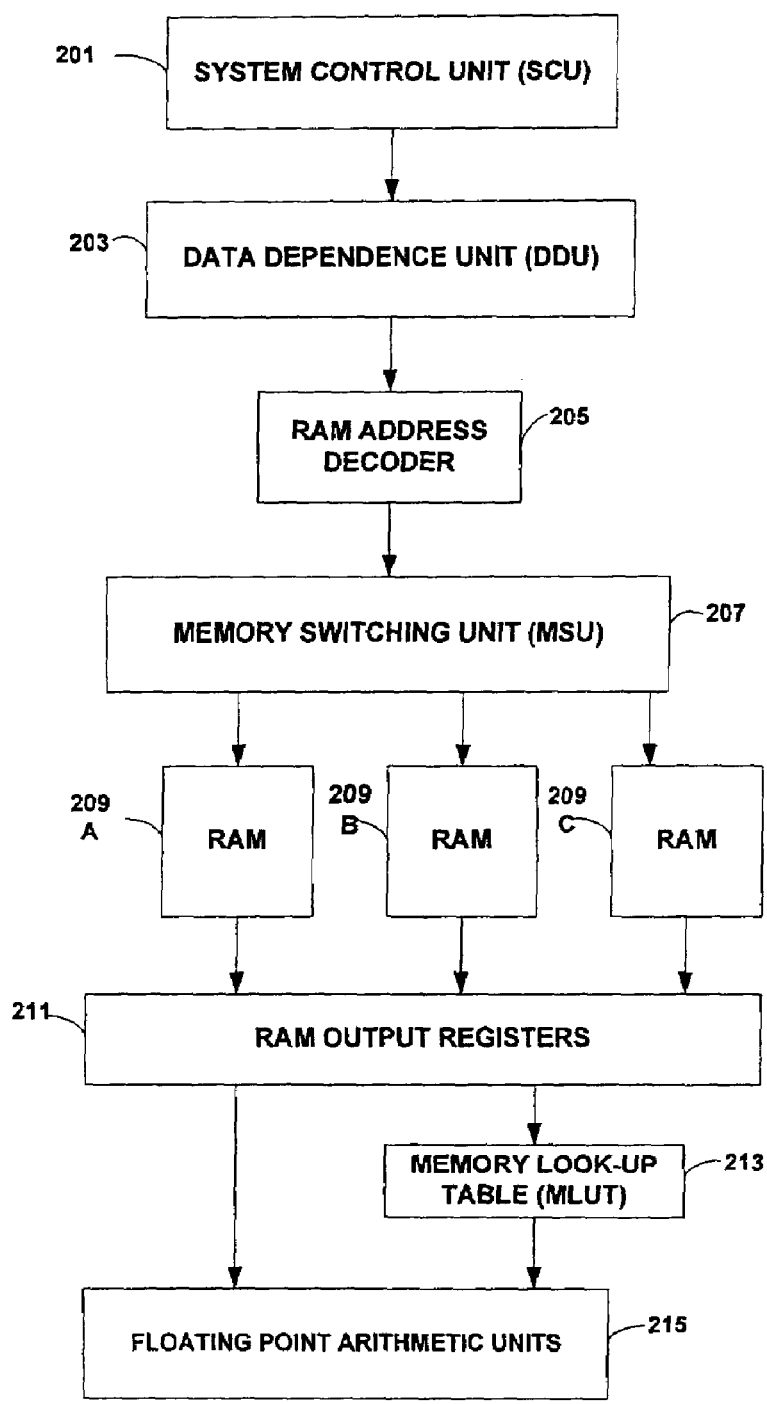
FIG. 2 is an exemplary block diagram of the apparatus of the present invention.

As discussed above and shown in FIG. 2, the present invention is an apparatus for a finite-difference time-domain hardware accelerator, comprising: a system control (SCU) 201; a data dependence unit (DDU) 203 configured to determine all dependencies associated with a calculation; a plurality of random access memory (RAM) units 209A, 209B, 209C associated with a RAM Address Decoder 205 and RAM Output Registers 211; a memory switching unit 207 configured to coordinate multiple memory reads and writes from/to the plurality of RAM units 209A, 209B, 209C; a memory look-up table 213 configured to decrease memory requirements; and at least one floating-point arithmetic unit 215 optimized for speed and configured to decrease execution time. In the embodiment of the apparatus shown in FIG. 1, the data dependence unit 203 is connected to the system control unit 201 and the RAM Address Decoder 205, the memory switching unit 207 is connected to the RAM Address Decoder 205 and the plurality of RAM units 209A, 209B, 209C, the RAM Output Registers 211 are connected to both the memory look-up table 213 and the at least one floating point arithmetic unit 215 and the memory look-up table 213 is connected to the at least one floating point arithmetic unit 215. Additional details of the operations of the above elements of the apparatus of the present invention are further discussed below.

DETAILED DESCRIPTION OF THE EMBODIMENTS OF THE INVENTION

The following detailed description does not limit the invention. Instead, the scope of the invention is defined by the appended claims and equivalents thereof. When constructing the FDTD hardware accelerator, the present invention may utilize some of the components and/or methods that facilitate implementation of the FDTD hardware accelerator, as described more fully below. Preferably, however, the present invention will utilize all of the components and/or methods described below when constructing the FDTD hardware accelerator. Each component and/or method that facilitates implementation of the FDTD hardware accelerator will be described separately below.

A. Reformulated FDTD Algorithm

The conventional FDTD algorithm contains several distinct regions that require different mathematical expressions. These include the normal FDTD space, the absorbing boundary region, and the incident source condition. In one aspect, the present invention may use an alternative approach to the conventional FDTD algorithm by imbedding all three regions into a single set of mathematical expressions. These twelve (12) expressions implicitly contain the normal FDTD region, perfectly matched layer (PML) absorbing boundaries, and the incident source through a connecting boundary condition. (See, e.g., J. P. Berenger, *A Perfectly Matched Layer for the Absorption of Electromagnetic Waves*, J. of Computational Physics, vol. 114, pp. 94–103 (1994)).

Because the set of equations must contain the PML regions, the fields are implemented in a split-field formulation. Here, any field component can be expressed as the sum of two split-field components, such as:

$$E_x = E_{xy} + E_{xz}$$

$$E_y = E_{yx} + E_{yz}$$

$E_z = E_{zx} + E_{zy}$ $H_x = H_{xy} + H_{xz}$ $H_y = H_{yx} + H_{yz}$ $H_z = H_{zx} + H_{zy}$

The reformulated FDTD equations become:

$E_{xy}|_{i,j,k}^{n+1} = A_2(m_y)E_{xy}|_{i,j,k}^n +$
$B_2(m_y)\left(H_{zx}|_{i,j,k}^{n+1/2} - H_{zx}|_{i,j-1,k}^{n+1/2} + H_{zy}|_{i,j,k}^{n+1/2} - H_{zy}|_{i,j-1,k}^{n+1/2} + \delta_{xy}^E|_{i,j,k}H_z^{inc}|_{i,j,k}^{n+1/2}\right)$ $E_{xz}|_{i,j,k}^{n+1} = A_3(m_z)E_{xy}|_{i,j,k}^n -$
$B_3(m_z)\left(H_{yx}|_{i,j,k}^{n+1/2} - H_{yx}|_{i,j,k-1}^{n+1/2} + H_{yz}|_{i,j,k}^{n+1/2} - H_{yz}|_{i,j,k-1}^{n+1/2} + \delta_{xz}^E|_{i,j,k}H_z^{inc}|_{i,j,k}^{n+1/2}\right)$ $E_{yx}|_{i,j,k}^{n+1} = A_1(m_x)E_{yx}|_{i,j,k}^n -$
$B_1(m_x)\left(H_{zx}|_{i,j,k}^{n+1/2} - H_{zx}|_{i-1,j,k}^{n+1/2} + H_{zy}|_{i,j,k}^{n+1/2} - H_{zy}|_{i-1,j,k}^{n+1/2} + \delta_{yx}^E|_{i,j,k}H_z^{inc}|_{i,j,k}^{n+1/2}\right)$ $E_{yz}|_{i,j,k}^{n+1} = A_3(m_z)E_{yz}|_{i,j,k}^n +$
$B_3(m_z)\left(H_{xy}|_{i,j,k}^{n+1/2} - H_{xy}|_{i,j,k-1}^{n+1/2} + H_{xz}|_{i,j,k}^{n+1/2} - H_{xz}|_{i,j,k-1}^{n+1/2} + \delta_{yz}^E|_{i,j,k}H_x^{inc}|_{i,j,k}^{n+1/2}\right)$ $E_{zx}|_{i,j,k}^{n+1} = A_1(m_x)E_{zx}|_{i,j,k}^n +$
$B_1(m_x)\left(H_{yx}|_{i,j,k}^{n+1/2} - H_{yx}|_{i-1,j,k}^{n+1/2} + H_{yz}|_{i,j,k}^{n+1/2} - H_{yz}|_{i-1,j,k}^{n+1/2} + \delta_{zx}^E|_{i,j,k}H_y^{inc}|_{i,j,k}^{n+1/2}\right)$ $E_{zy}|_{i,j,k}^{n+1} = A_2(m_y)E_{zy}|_{i,j,k}^n -$
$B_2(m_y)\left(H_{xy}|_{i,j,k}^{n+1/2} - H_{xy}|_{i,j-1,k}^{n+1/2} + H_{xz}|_{i,j,k}^{n+1/2} - H_{xz}|_{i,j-1,k}^{n+1/2} + \delta_{zy}^E|_{i,j,k}H_x^{inc}|_{i,j,k}^{n+1/2}\right)$ $H_{xy}|_{i,j,k}^{n+1/2} = A_5(m_y)H_{xy}|_{i,j,k}^{n-1/2} -$
$B_5(m_y)\left(E_{zx}|_{i,j+1,k}^n - E_{zx}|_{i,j,k}^n + E_{zy}|_{i,j+1,k}^n - E_{zy}|_{i,j,k}^n + \delta_{xz}^H|_{i,j,k}E_z^{inc}|_{i,j,k}^n\right)$ $H_{xz}|_{i,j,k}^{n+1/2} = A_6(m_z)H_{xz}|_{i,j,k}^{n-1/2} +$
$B_6(m_z)\left(E_{yx}|_{i,j,k+1}^n - E_{yx}|_{i,j,k}^n + E_{yz}|_{i,j,k+1}^n - E_{yz}|_{i,j,k}^n + \delta_{xz}^H|_{i,j,k}E_y^{inc}|_{i,j,k}^n\right)$ $H_{yz}|_{i,j,k}^{n+1/2} = A_6(m_z)H_{yz}|_{i,j,k}^{n-1/2} -$
$B_6(m_z)\left(E_{xy}|_{i,j,k+1}^n - E_{xy}|_{i,j,k}^n + E_{xz}|_{i,j,k+1}^n - E_{xz}|_{i,j,k}^n + \delta_{xz}^H|_{i,j,k}E_x^{inc}|_{i,j,k}^n\right)$ $H_{yx}|_{i,j,k}^{n+1/2} = A_4(m_x)H_{yx}|_{i,j,k}^{n-1/2} +$
$B_4(m_x)\left(E_{zx}|_{i+1,j,k}^n - E_{zx}|_{i,j,k}^n + E_{zy}|_{i+1,j,k}^n - E_{zy}|_{i,j,k}^n + \delta_{yx}^H|_{i,j,k}E_z^{inc}|_{i,j,k}^n\right)$ $H_{zx}|_{i,j,k}^{n+1/2} = A_4(m_x)H_{zx}|_{i,j,k}^{n-1/2} -$
$B_4(m_x)\left(E_{yx}|_{i+1,j,k}^n - E_{yx}|_{i,j,k}^n + E_{yz}|_{i+1,j,k}^n - E_{yz}|_{i,j,k}^n + \delta_{zx}^H|_{i,j,k}E_y^{inc}|_{i,j,k}^n\right)$ $H_{zy}|_{i,j,k}^{n+1/2} = A_5(m_y)H_{zy}|_{i,j,k}^{n-1/2} +$
$B_5(m_y)\left(E_{xy}|_{i,j+1,k}^n - E_{xy}|_{i,j,k}^n + E_{xz}|_{i,j+1,k}^n - E_{xz}|_{i,j,k}^n + \delta_{zy}^H|_{i,j,k}E_x^{inc}|_{i,j,k}^n\right)$ and the coefficients are:

$A_1 = \left[\dfrac{1 - \dfrac{\sigma_x(m_x)\Delta t}{2\varepsilon_x(m_x)}}{1 + \dfrac{\sigma_x(m_x)\Delta t}{2\varepsilon_x(m_x)}}\right], A_2 = \left[\dfrac{1 - \dfrac{\sigma_y(m_y)\Delta t}{2\varepsilon_y(m_y)}}{1 + \dfrac{\sigma_y(m_y)\Delta t}{2\varepsilon_y(m_y)}}\right], A_3 = \left[\dfrac{1 - \dfrac{\sigma_z(m_z)\Delta t}{2\varepsilon_z(m_z)}}{1 + \dfrac{\sigma_z(m_z)\Delta t}{2\varepsilon_z(m_z)}}\right]$ -continued $A_4 = \left[\dfrac{1 - \dfrac{\sigma_x^*(m_x)\Delta t}{2\mu_o}}{1 + \dfrac{\sigma_x^*(m_x)\Delta t}{2\mu_o}}\right], A_5 = \left[\dfrac{1 - \dfrac{\sigma_y^*(m_y)\Delta t}{2\mu_o}}{1 + \dfrac{\sigma_y^*(m_y)\Delta t}{2\mu_o}}\right], A_6 = \left[\dfrac{1 - \dfrac{\sigma_z^*(m_z)\Delta t}{2\mu_o}}{1 + \dfrac{\sigma_z^*(m_z)\Delta t}{2\mu_o}}\right]$ $B_1 = \left[\dfrac{\dfrac{\Delta t}{\varepsilon_x(m_x)\Delta x}}{1 + \dfrac{\sigma_x(m_x)\Delta t}{2\varepsilon_x(m_x)}}\right], B_2 = \left[\dfrac{\dfrac{\Delta t}{\varepsilon_y(m_y)\Delta y}}{1 + \dfrac{\sigma_y(m_y)\Delta t}{2\varepsilon_y(m_y)}}\right], B_3 = \left[\dfrac{\dfrac{\Delta t}{\varepsilon_z(m_z)\Delta z}}{1 + \dfrac{\sigma_z(m_z)\Delta t}{2\varepsilon_z(m_z)}}\right]$ $B_4 = \left[\dfrac{\dfrac{\Delta t}{\mu_o \Delta x}}{1 + \dfrac{\sigma_x^*(m_x)\Delta t}{2\mu_o}}\right], B_5 = \left[\dfrac{\dfrac{\Delta t}{\mu_o \Delta y}}{1 + \dfrac{\sigma_y^*(m_y)\Delta t}{2\mu_o}}\right], B_6 = \left[\dfrac{\dfrac{\Delta t}{\mu_o \Delta z}}{1 + \dfrac{\sigma_z^*(m_z)\Delta t}{2\mu_o}}\right].$ Where, E is the electric field; H is the magnetic field; i, j, and k are the x, y, and z coordinates, respectively, of the node currently being updated; m is the material type (a bit vector representing the material type in the x, y, or z direction) of the node currently being updated; A and B are arbitrary names for coefficients that weight the fields in the above computations, and δ is −1, 0, or 1 (used to turn on or turn off the incident fields).

Hence, Maxwell's equations are split into twelve equations that can be discretized using the standard Yee algorithm. (See, e.g., K. S. Yee, *Numerical Solution of Initial Boundary Value Problems Involving Maxwell's Equations in Isotropic Media*, IEEE Transactions on Antennas and Propagation, vol. 14, pp. 302–307 (1966)).

B. Material Look-Up Table (MLUT)

There are nine values associated with any given node that represent the material properties of that node. When implementing PML absorbing boundaries, even more values are necessary, namely, the magnetic conductivity in the x, y, and z directions.

However, the coefficients, $A_1$–$A_6$ and $B_1$–$B_6$, are constant for a given material. Hence, in another aspect, rather than store all the material properties at every node, the present invention proposes storing only a small bit vector representing the material type of the node. Then, the values of coefficients $A_1$–$A_6$ and $B_1$–$B_6$ can be looked up from a material look-up table (MLUT) based on this material type. In addition to saving memory, the MLUT also saves computations. Without the MLUT, all material parameters would have to be stored, and then the coefficients $A_1$–$A_6$ and $B_1$–$B_6$ computed. With the MLUT, the present invention enables storage of a few bits to denote the material type and looks up the corresponding coefficients in the table with no need to compute the coefficients. Storage of the entire problem's material structure requires only storage of three small integers (representing the material types in the x, y and z directions) at each node, thus saving memory and computational requirements.

C. Customized Floating-Point Arithmetic Units

In order to optimize the solution of the FDTD equations, the present invention, in still another aspect, may implement customized, IEEE 754 standard-based (compliant) floating-point arithmetic units. These adders and multipliers may be based on the IEEE 754 standard, but preferably are not fully compliant with the standard. If speed is to be one of the most important design features, the present invention proposes removing features that would otherwise slow the arithmetic units down. As an example of one feature that may be removed, the arithmetic units of the present invention would not support denormalized numbers. Rather, any number that would normally be denormalized is simply rounded to zero. As another example of a feature that may be removed, the arithmetic units of the present invention would not support all four rounding methods outlined in the IEEE 754 standard. Instead, the arithmetic units of the present invention would only support "round to zero" method. These exemplary optimizations allow the arithmetic units of the present invention to run faster than fully compliant arithmetic units. However, other optimizations may be possible within the scope of the present invention.

D. Memory Switching Unit

An efficient hardware-based implementation utilizes multiple memory banks to allow parallel access to data, thereby keeping the computational pipelines full, and maximizing throughput. Multiple, independent banks of RAM require multiple RAM controllers, with each controller requiring its own unique address, control, and data lines. Furthermore, requests to fetch data or write updated values back to memory can come from several locations. This presents a control nightmare.

To overcome this, the present invention, in still another aspect, may utilize a specific memory switching unit responsible for handling all memory input/output (I/O) requests. This memory switching unit would organize which values need to be fetched, determine the appropriate RAM to fetch them from, and handle all control signaling that must take place. In this manner, the memory switching unit of present invention becomes a single "smart" unit. This simplifies control and provides the computational units transparent access to an array of RAM modules.

E. Data Dependence Unit

Surrounding field values must be used to update a given field component. Hence, logic is required that determines which fields are necessary to update a field. In conventional implementations, this logic has been hardcoded into the hardware. Hence, every node was preprogrammed with the values it needed to fetch to update a given field component. However, this wastes logic as values are fetched in a regular pattern.

To address this problem, the present invention, in still another aspect, may use a data dependence unit that determines which field values are required to update a given field component. This data dependence unit takes the coordinates and the type of field to fetch, and outputs at regular intervals the necessary field types and coordinates.

F. System Control

The present invention may also have a system control that utilizes a counter-based finite-state machine (FSM). An FSM is a model of computation consisting of a set of states, a start state, an input alphabet, and a transition function that maps input symbols and current states to a next state. Computation begins in the start state with an input string. It changes to new states depending on the transition function. There are many variants, for instance, machines having actions (outputs) associated with transitions (Mealy machine) or states (Moore machine), multiple start states, transitions conditioned on no input symbol (a null) or more than one transition for a given symbol and state (nondeterministic finite state machine), one or more states designated as accepting states (recognizer), etc.

In this scenario, a global counter is incremented every rising edge of the clock. All units (e.g., customized floating-point arithmetic units, memory switching unit, and data dependence unit) may then probe the value of this counter. Based on a FSM internal to each unit (e.g., the customized, floating-point arithmetic units, the memory switching unit, and the data dependence unit) and the current value of the counter, each unit will "turn on" or "turn off" at the appropriate time. This is powerful since it describes the control of each unit without the usual handshaking, and allows timing modifications to be easily incorporated into the design.

It will be apparent to those skilled in the art that various modifications and variations can be made in the components and methods for facilitating implementation of a finite-difference time-domain (FDTD) hardware accelerator of the present invention and in construction of the components or methods without departing from the scope or spirit of the invention. As an example, the present invention could use a non-split field formulation; might not include source, boundary conditions, and a standard mesh in one equation; could use an absorbing boundary condition other than PML; and could implement fully compliant arithmetic units.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for implementing a finite-difference time-domain (FDTD) hardware accelerator, comprising:
reformulating an FDTD algorithm by embedding a normal FDTD space, an absorbing boundary region, and an incident source condition into a single set of mathematical expressions;
storing a small bit vector representing a material type of a node of a mesh; providing a material look-up table that stores values of coefficients that can be looked up based on the material type;
providing customized, floating-point arithmetic units based on the IEEE 754 standard;
providing a memory switching unit responsible for handling all memory input/output (I/O) requests; providing a data dependence unit that determines which field values are required to update a given field component; and
providing a system control that utilizes a counter-based finite-state machine (FSM).

2. A method for implementing a finite-difference time-domain (FDTD) hardware accelerator as recited in claim 1, wherein the customized, floating-point arithmetic units, the memory switching unit, and the data dependence unit probe the value of the counter of the system control.

3. A method for implementing a finite-difference time-domain (FDTD) hardware accelerator as recited in claim 2, wherein based on a FSM internal to the customized, floating-point arithmetic units, the memory switching unit, and the data dependence unit, and the current value of the counter, the memory switching unit, the data dependence unit, and each of the customized, floating-point arithmetic units will turn on or turn off at an appropriate time.

4. A method for implementing a finite-difference time-domain (FDTD) hardware accelerator as recited in claim 1, wherein the storing step comprises storing three integers representing the material types in the x, y and z directions at each node.

* * * * *